United States Patent
Wensel

(10) Patent No.: US 6,417,028 B2
(45) Date of Patent: Jul. 9, 2002

(54) METHOD AND APPARATUS FOR REMOVING CONTAMINANTS ON ELECTRONIC DEVICES

(75) Inventor: Richard W. Wensel, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/832,977

(22) Filed: Apr. 12, 2001

Related U.S. Application Data

(62) Division of application No. 09/032,119, filed on Feb. 27, 1998, now Pat. No. 6,230,719.

(51) Int. Cl.⁷ .............................................. H01L 21/44
(52) U.S. Cl. .................... 438/112; 438/124; 438/126; 438/127
(58) Field of Search .................... 438/112, 123, 438/124, 125, 126, 127, 800, 905, 906

(56) References Cited

U.S. PATENT DOCUMENTS

| 4,486,461 A | 12/1984 | Ito et al. |
| 4,968,397 A | 11/1990 | Asher et al. |
| 5,063,015 A | 11/1991 | Lloyd et al. |
| 5,121,706 A | 6/1992 | Nichols et al. |
| 5,192,681 A * | 3/1993 | Chiu .......................... 438/112 |
| 5,318,677 A | 6/1994 | Hirbour et al. |
| 5,362,370 A | 11/1994 | Van der Heijden |
| 5,456,757 A | 10/1995 | Aruga et al. |
| 5,487,172 A | 1/1996 | Hyatt |
| 5,621,813 A | 4/1997 | Brown et al. |
| 5,676,588 A | 10/1997 | Frederick et al. |
| 5,693,573 A | 12/1997 | Choi |
| 5,759,873 A | 6/1998 | Kata et al. |
| 5,766,404 A | 6/1998 | Rigali et al. |
| 5,939,775 A * | 8/1999 | Bucci et al. ................. 257/667 |
| 6,001,672 A * | 12/1999 | Wensel .................. 264/272.17 |
| 6,063,139 A | 5/2000 | Fukaya |
| 6,069,070 A * | 5/2000 | Labunov et al. ............ 438/618 |

* cited by examiner

Primary Examiner—Kevin M. Picardat
(74) Attorney, Agent, or Firm—Dickstein Shapiro Morin & Oshinsky LLP

(57) ABSTRACT

The invention provides a unique method and apparatus for removing flash or other contaminants from an electronic package such as encapsulated semiconductor device by exposing the device to plasma gas. In a preferred embodiment, a plasma gas cleaner is provided with a reaction chamber used to house the encapsulated device during a deflashing procedure. Plasma gas is supplied to the reaction chamber for reaction on the surfaces of the device. The reaction of the plasma on these surfaces successfully removes excess encasing material and other contaminants. The plasma gas cleaner may be a plasma gas device used for other process steps (e.g., plasma etching) employed during the fabrication and manufacture of the semi conductor device.

16 Claims, 6 Drawing Sheets

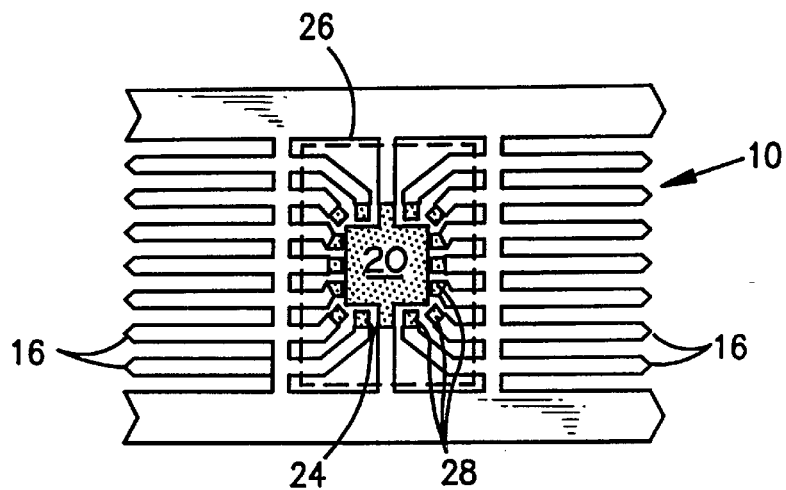
FIG. 1
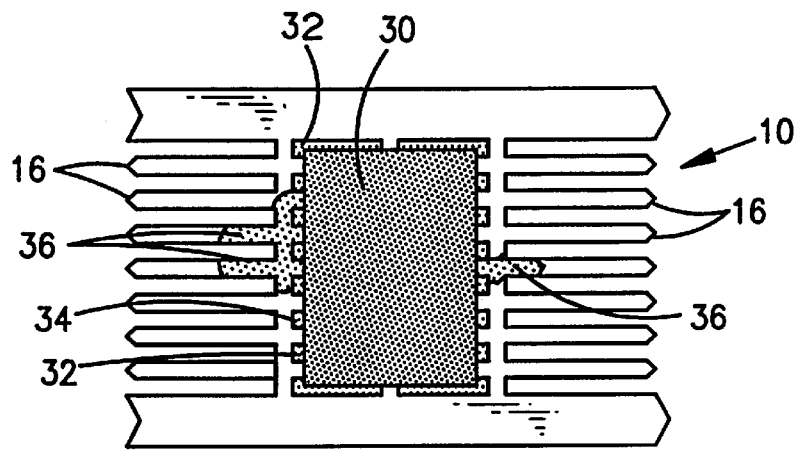
FIG. 2
FIG. 3
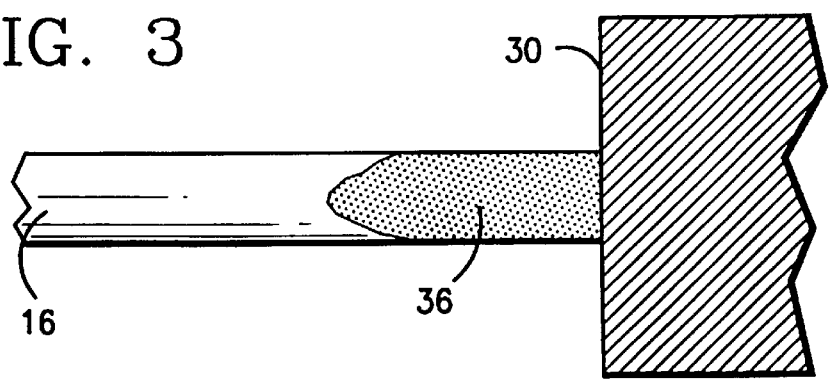

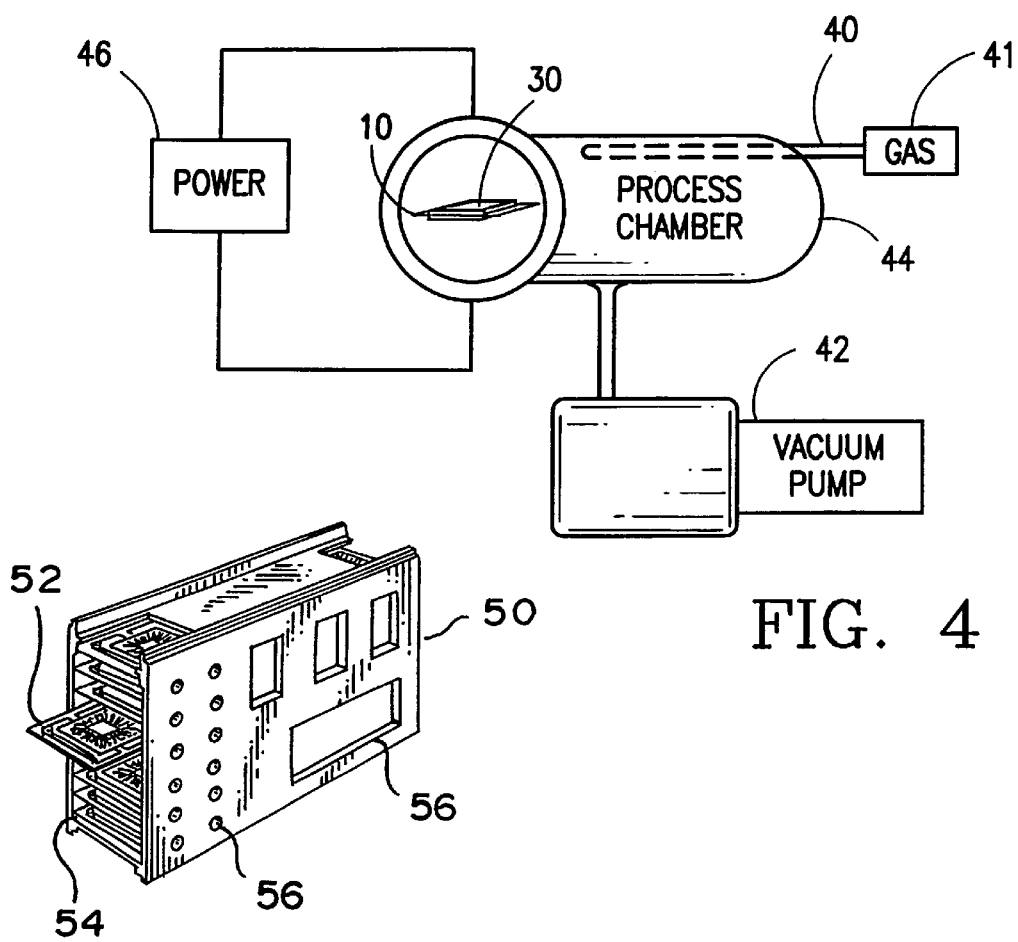
FIG. 4
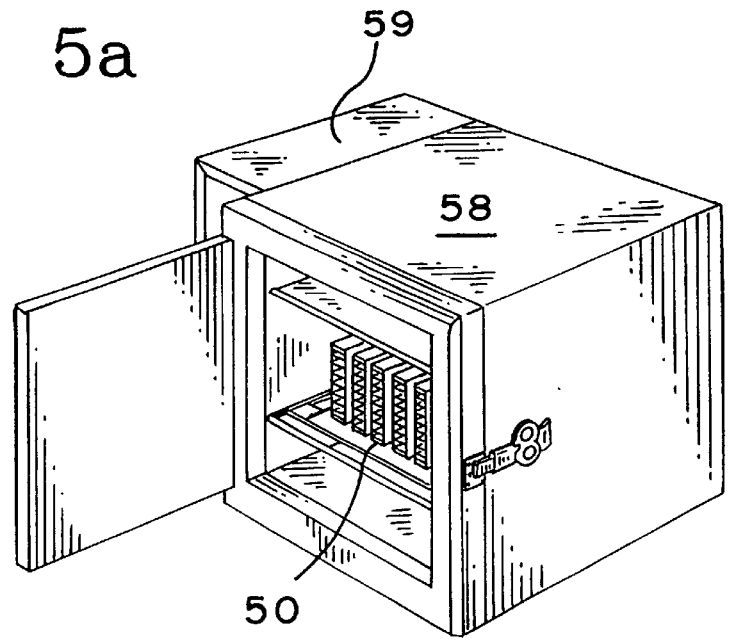
FIG. 5a
FIG. 5b

METHOD AND APPARATUS FOR REMOVING CONTAMINANTS ON ELECTRONIC DEVICES

This application is a divisional of application Ser. No. 09/032,119, filed Feb. 27, 1998, now U.S. Pat. No. 6,230,719, the subject matter of which is incorporated by reference herein.

BACKGROUND OF THE INVENTION

1. Field of the Invention

The invention is directed to the field of manufacturing electronic devices. More specifically, the invention is directed to cleaning systems and methods used to remove foreign material such as flash and other contaminants from external leads of the electronic devices.

2. Description of Related Art

Intricate electronic devices such as semiconductor integrated circuits (ICs) (or "chips") are typically housed in an encasing referred to as a "package." The package typically includes a "lead frame" that is electrically connected to the IC within the package, and extends outward to allow electrical connection of the IC to a circuit board or other product. One of the most popular package types used in the art is known as the "epoxy molding" or "plastic" package. With this type of package, the IC and lead frame are enclosed or encapsulated by a plastic or resin material that serves to protect the chip from moisture, contamination, and other physical or environmental conditions.

The basic process flow for the manufacture of a plastic package of a semiconductor device starts with the attachment and bonding of the IC die to a lead frame containing a number of leads. A preseal inspection often is performed to ensure that the die is attached correctly. A plasma cleaning step may be included prior to wire bonding to remove any residual photoresist, or other organic contaminants on the bonding surfaces of the die. The bonding surfaces of the IC die are then respectively connected to individual leads on the lead frame with very thin wires during the wire bonding step. The lead frames and attached dies are then transferred to a molding area.

In the molding area, the frames are placed on a mold mounted in a transfer molding machine. The molding machine in turn injects epoxy or other plastic encasing material into the mold around the die on the lead frames, thereby forming an individual package around each lead frame leaving only external (outer) leads exposed to the environment. A plating step is often used to coat the external leads of the package with a metal finish so as to improve the lead solderability, resulting in a more reliable electrical connection of the package and the printed circuit. After the epoxy sets in the mold, the frames are removed and placed in an oven for final curing.

Often, as a result of the molding step, excess plastic, resin, wax or other organic residue material, such as trace oxides or contaminants, can be found around the casing of the encapsulated chip, as well as on and between the external leads of the chip. As shown in accompanying FIG. 1, a typical lead frame 10 is used to provide external electrical connections to IC die 20. Once the die 20 is mounted on the lead frame 10 and the appropriate wire bonds are made to inner leads 24, 28, the lead frame 10 is exposed to an encapsulation process step. In this process step, the die 20 and inner leads 24 (around the boundary indicated by the dashed line 26) will be encapsulated by a molded plastic casing 30 (FIG. 2).

During this encapsulation process, the lead frame 10 is inserted into a mold cavity while the leads 16 extend outside of the cavity. The mold is heated and the plastic is injected into the mold in liquid or semi-liquid form under very high pressure. Due to its fluidity, the plastic material leaks out of the mold through any crevices where the sealing is imperfect. As a result, excess encasing material 36 (FIGS. 2 and 3) "bleeds" out of the encapsulated chip package 30 onto and between leads 16. This excess encasing material 36 is referred to in the art as "flash." Flash is detrimental to the fabrication process in that its presence adversely affects the subsequent soldering, trimming and forming operations, in addition to the overall electrical characteristics of the device.

To avoid the problems caused by flash, another process step often referred to as "deflash" or "flash removal" is commonly added to the basic process flow. Most of the known methods employed to perform this deflash step involve exposing the device to chemical solvents or abrasive blasting. The flash removal system shown in U.S. Pat. No. 5,318,677, for example, performs the deflashing step by dipping the components in a bath of glycerol and phosphate. In another example, the cryogenic deflashing system of U.S. Pat. No. 5,676,588, attempts to remove flash by exposing devices to cryogenic material such as liquid nitrogen (at a temperature of about −60° F. or below) and blasting the devices with particulate media. Many other variations of these two types of deflashing procedures are known in the art.

The chemical solvent-based deflashing procedures are problematic because of the liquid waste that is produced leading to environmental concerns regarding the handling and disposing of the used solvents.

The essential disadvantage of the abrasive-type of flash removal systems is that minute quantities of the blasting abrasive become embedded in the surface of the electronic part (e.g., lead). These embedded particles must be carefully removed before proceeding with other process steps such as plating the surface with a metallic (solderable) coating. The abrasive deflashing procedure is also often incomplete in regions leaving very thin layers of residue that are very difficult to detect upon inspection with the naked eye.

SUMMARY OF THE INVENTION

The invention provides a unique apparatus for and method of removing flash or other contaminants from electronic packages such as encapsulated semiconductor devices by exposing the devices to plasma gas. In a preferred embodiment, a plasma cleaner is provided with a reaction chamber used to house the devices during a deflashing procedure. Plasma gas is supplied to the reaction chamber for reaction on the surfaces of the devices. The reaction of the plasma on these surfaces operates to successfully remove the excess encasing material and other contaminants often found on the devices (particularly on their leads) that may interfere with the proper manufacture or operation of the device.

In another preferred embodiment, the invention makes use in the deflashing procedure of the same (or part of the same) plasma gas cleaner used for other process steps (e.g., plasma etching) during the fabrication and manufacture of the electronic device.

Among the many advantages derived from the invention include the removal of flash without degrading the surface of the leads, without leaving any organic residue or other film, and without producing any liquid waste. Also, the gaseous waste does not cause environmental concerns (ie, the gases released are non-toxic like $H_2O$, CO, $CO_2$, etc). In addition, exposing the encasing material (bulk, not the flash) to the plasma field could result in chemical changes on the surface producing a stronger or tougher package. The plasma could also induce some curing to occur on the surface of the bulk of the package.

BRIEF DESCRIPTION OF THE DRAWINGS

The foregoing and other advantages of the invention will become more apparent from the detailed description of the preferred embodiments of the present invention given below with reference to the accompanying drawings in which:

FIG. 1 illustrates an integrated circuit (IC) die attached to a lead frame;

FIG. 2 illustrates the IC die and lead frame encapsulated by a molded encasing material and having molding flash;

FIG. 3 illustrates flash on an external lead of the encased lead frame;

FIG. 4 shows a block diagram of a plasma deflash apparatus in accordance with a preferred embodiment of the invention;

FIGS. 5a, 5b, and 5c show a plasma cleaner in accordance with a preferred embodiment of the invention;

DETAILED DESCRIPTION OF PREFERRED EMBODIMENTS

Figure 5C:
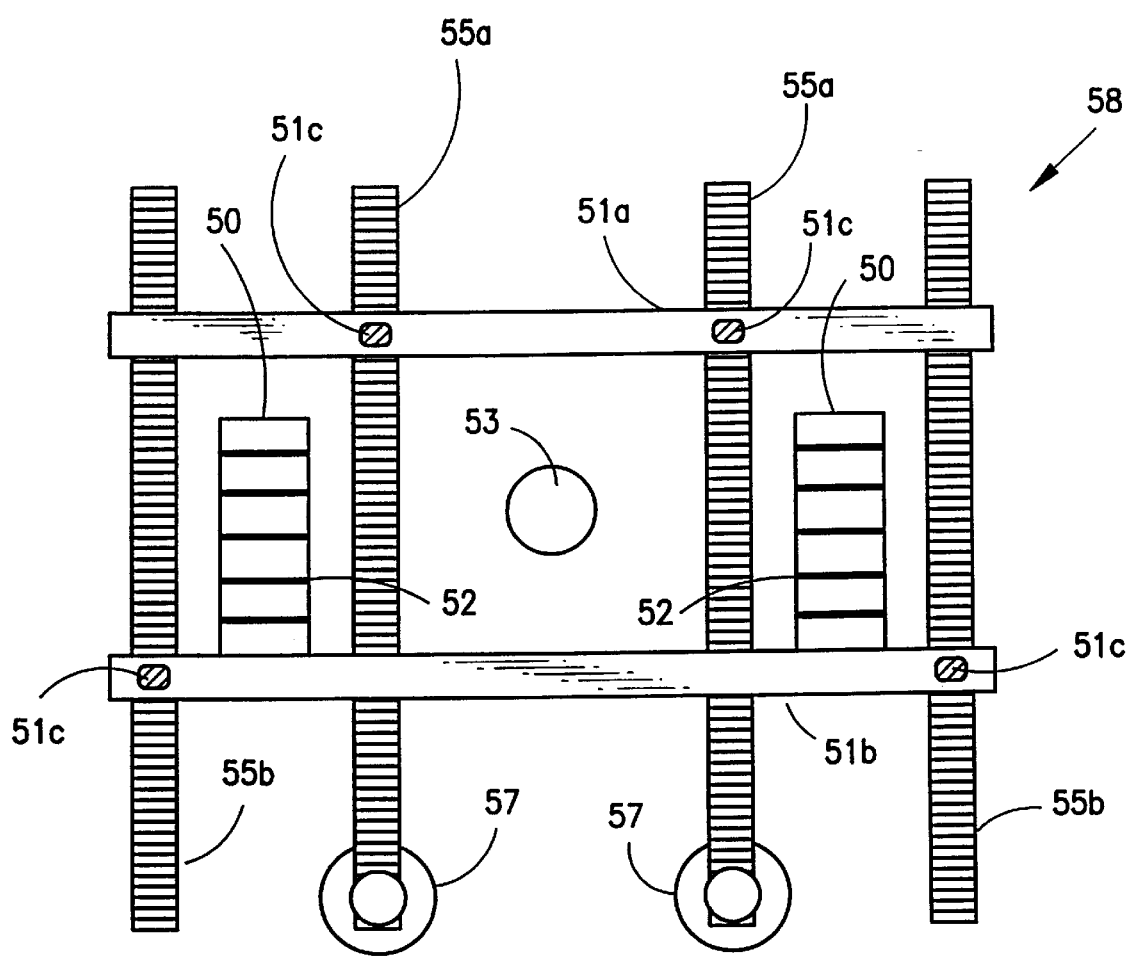

The present invention will be described in detail as set forth in the preferred embodiments illustrated in FIGS. 4 through 7. Although these embodiments depict the invention in its preferred application to a semiconductor memory device, it should be readily apparent that the invention has equal application to any type or configuration of semiconductor device (e.g., microprocessor, microcomputer, digital signal processor (DSP), programmable logic array (PLA), etc.) in any type of molded packaging (e.g., dual in-line (DIP), flatpack (FP), leadless chip carrier (LCC), pin-grid array (PGA), etc.), as well as any other electronic device that encounters the same or similar problems.

The invention operates to remove troublesome flash or resin-bleed, shown in FIGS. 1–3, by exposing the encapsulated package 30 and its external leads 16 to a novel deflashing apparatus and method that utilizes plasma gas to remove the flash 32, 34, 36 without degrading the surface of the leads, without leaving any organic residue or other film, and without producing any liquid waste.

In accordance with a preferred embodiment of the invention, a plasma cleaner for performing the flash removal is depicted in block form in FIG. 4. The plasma cleaner includes a process chamber 44 (also referred to as a "reaction chamber") used to temporarily house one or more semiconductor packages, represented in FIG. 4 as lead frame 10 and casing 30, during the deflashing procedure. A supply of gas 41 is included to provide a source of gas to the process chamber 44 from which a reactive plasma can be generated, as will be discussed below.

Preferably, the gas supplied in source 41 is Argon (or, alternatively, Oxygen) or Argon combined with any number of plasma forming gases (e.g., $O_2$, $H_2$, $CF_4$, He, air, etc.) known to be used by those of ordinary skill in the art. In another preferred embodiment, the plasma cleaner used for deflashing in accordance with the invention may be the same, or part of the same, plasma cleaner used for other plasma-based process steps, e.g., dry etching, etc., used in the fabrication or manufacture of the electronic package. The gas from source 41 is introduced into the process chamber 44 through gas inlet 40, which may be formed integrally with the process chamber 44 itself, or as a separate structure, e.g., external tubing, or by any known construct that permits controlled communication of gas from source 41 to process chamber 44.

A power supply 46 is coupled to process chamber 44 to provide a source of direct current (DC) voltage or radio frequency (RF) energy to the gas in the process chamber 44. When supplying RF energy, preferably the power supply 46 is operating in the range of 1 KHz to 100 GHz with almost any gas. Although not shown, the power supply 46 may apply its output energy through the use of electrodes (either external or internal) to the chamber. Alternative mechanisms known in the art to generate plasma could also be utilized such as DC abnormal glow discharges, parallel plate RF capacitive reactors, flat coil inductively coupled RF reactors, electron cyclotron resonance (ECR) microwave reactors, etc. The electric field derived from the energy output by power supply 46 as applied to the gas in the process chamber 44 is effective to convert the gas into a reactive plasma.

The plasma reacts at the surface of the semiconductor device placed in the process chamber 44. The plasma also reacts on the metallic surface of the external leads of lead frame 10 to break organic bonds between flash such as plastic, resin, wax flash or other contaminants, and the surface of the leads. In particular, the energy in the electric field in the chamber 44 is sufficient to dissociate the reactive gas. In this dissociation process, reactive gas molecules are broken into species including free radicals, i.e., neutral atoms or collections of atoms with incomplete bonding. These free radicals diffuse to the surfaces of the exposed lead frame 10 in random directions. Radicals are highly reactive chemically and are chiefly responsible for the removal of the organic material on the leads.

A vacuum pump 42, which maintains the pressure inside the process chamber 44 (usually run at pressures of 150 millitorr to 1500 millitorr), may be included in the plasma cleaner to remove the contaminant by-products resulting from the plasma reaction at the surface of the leads. In accordance with another preferred embodiment of the invention, the plasma cleaner may simultaneously accommodate a plurality of packages to allow for use in high throughput processes. As shown in FIG. 5a, a plurality of encapsulated packages 52 may be arrayed into a plurality of storage units 54 (e.g., shelves), all housed in a magazine 50. The magazine has vent holes 56 that may take the form of any of a variety of shapes, e.g., circles, squares, rectangles, etc. These vent holes 56 permit the plasma gas to permeate through the magazine 50 and react with the surfaces of the individual packages 52. As shown in FIG. 5b, the reaction chamber 58 may house a plurality of magazines 50 for simultaneously performing a plasma deflashing process on a host of individual packages 52.

As a further illustration of the invention, the following example has been provided:

EXAMPLE

A plurality of semiconductor memories are housed in a magazine and placed in a plasma oven for 4 hours. The plasma oven has an internal temperature of 175° C. During this 4 hour period, plasma gas having 90% Argon is introduced into the plasma oven. A vacuum is applied to maintain the pressure between 300 mTorr–1 Torr. The plasma gas and vacuum are applied only between 5 and 20 minutes of the 4 hour period. An RF power supply (rated between 250–600 watts) generates an electric field that is also applied during this 5–20 minute period to the plasma oven. The purpose of keeping the packages in the oven for 4 hours is to cure the parts.

A cross-sectional view of one implementation of the reaction chamber 58 is shown in FIG. 5c, although many other implementations or variations developed by those skilled in the art may be utilized. The reaction chamber 58 shown in FIG. 5c contains shelving units in the form of powered shelf 51a and grounded shelf 51b used to support magazines 50 during the deflashing procedure. The powered shelf 51a is also used to conduct the RF energy supplied to the reaction chamber 58 through RF feedthru 57, power busses 55a, and conductive coupling links 51c. Similarly, grounded shelf 51b is used to maintain a grounded state through its connection with conductive coupling links 51c to ground busses 55b. A vacuum port 53 permits access to the system's vacuum pump 42 (FIG. 4), for implementations that use a vacuum pump.

Figure 6:
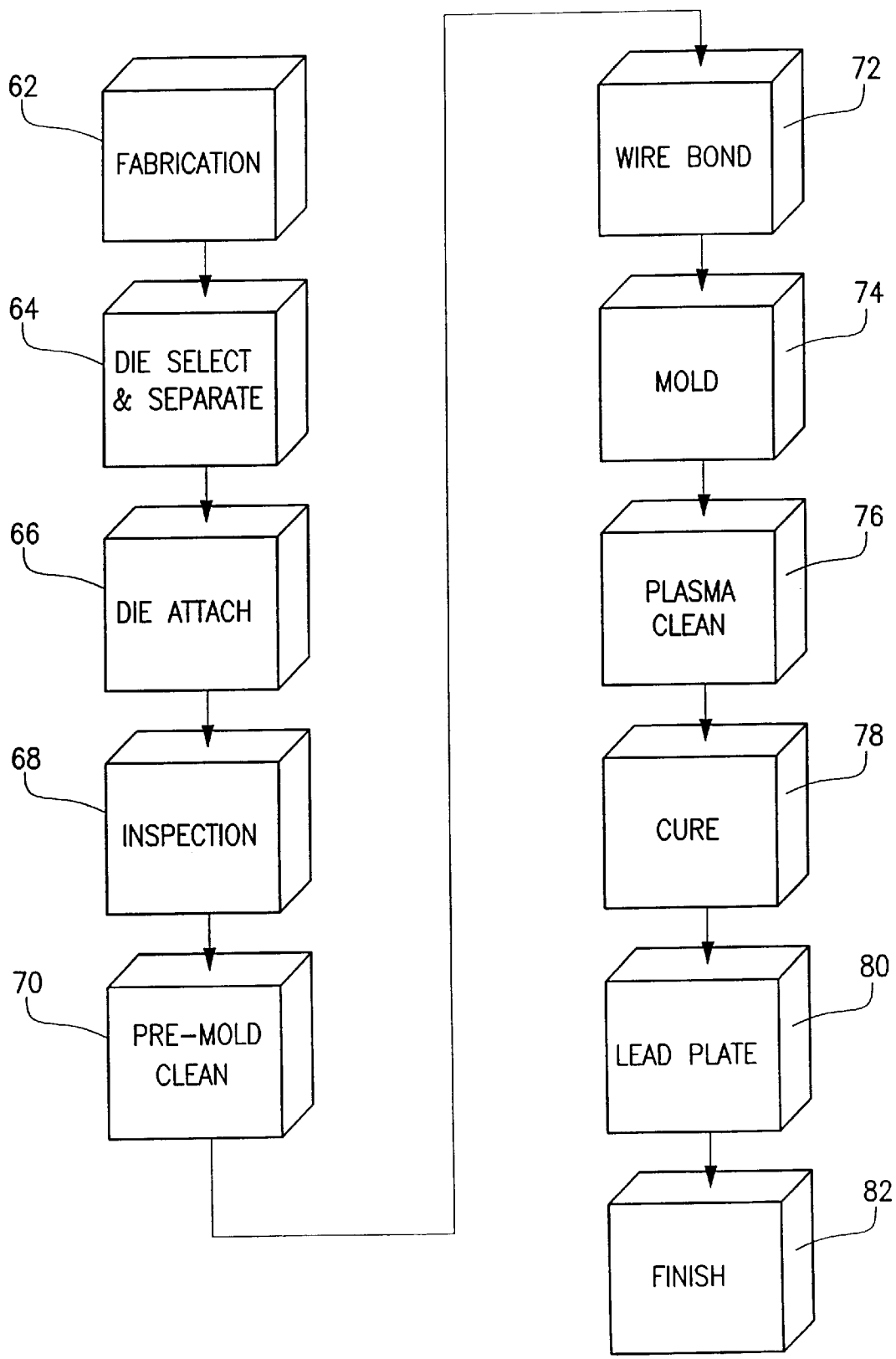
FIG. 6 is a chart depicting the basic process flow for manufacturing an electronic package in accordance with a preferred embodiment of the invention.

As described herein, the invention is operative to perform all or part of the flash removal required in the "deflash" step in any process of manufacturing electronic devices such as semiconductor memory devices. As shown in FIG. 6, the basic process flow for a typical process of manufacturing a semiconductor device embodying the invention starts with the fabrication step 62, where a plurality of semiconductor dies may be fabricated on a wafer. For each individual device, a respective one of the plurality of dies is selected and separated from the other dies (step 64). The selected die is then attached to the central pad or "island" of a lead frame (step 66) using epoxy, polyimide, eutectic or other attaching materials known in the art. A visual inspection of the die/lead frame combination may be made (step 68) to ensure proper alignment, absence of defects, etc.

A cleaning step 70 is sometimes then utilized to remove any excess adhesive or other contaminants that may reside on the surface of the die or on the inner leads of the lead frame. It is on these junctures that an electrical connection will be made (in step 72) between a bonding pad on the die and one of the inner leads of the lead frame. The combined structure is then transferred to a molding area where the structure is placed in a mold for encapsulation (step 74). Typically, a plastic or other workable resin is injected into the mold surrounding the die and the inner leads of the lead frame to form a encased package. Only the outer leads of the lead frame appear on the exterior of the package.

As noted in the section above, imperfections in the mold result in an excess of encasing material and other contaminants 32, 34, 36 (FIGS. 2 and 3) appearing on the casing itself 30, as well as on and between the outer leads 16 of the lead frame. In accordance with the invention, a "deflash" step, represented as step 76 in FIG. 6, utilizing a plasma gas, in the manner described above, is effective in removing the excess encasing material without leaving any residue or film and without damaging the surface material. The package is then sent to an oven or other heat chamber for final curing (step 78).

A lead plating process step is used to coat the external leads with a metal layer to enhance the conductivity of the leads (step 80). A number of finishing steps (represented by step 82) can then be employed to complete the fabrication and manufacture of the semiconductor device, as necessary. For example, the finishing steps may include: marking the encapsulated package, soldering the encapsulated package to a printed circuit board, performing electrical or physical tests of the device, placing the package in device tubes for shipment, etc.

As should be readily apparent, many of the basic process flow steps discussed above may vary (e.g., order of steps changed, steps added, steps subtracted, steps substituted, etc.) without detracting from the invention. For example, the lead plating step 80 may easily be performed prior to final curing in step 78. Indeed, in another preferred embodiment, the plasma clean step 76 and cure step 78 are implemented simultaneously using the same chamber. As shown in FIG. 5b, the plasma cleaner can be modified to add a source of heat 59 to provide the heat necessary to cure the molded package directly in the reaction chamber 58. The heat output from the source 59 may be supplied to reaction chamber 58 in any manner known in the art. Moreover, the plasma cleaner used to perform the plasma clean step 76 in accordance with the invention may be the same plasma cleaner used to perform one or more plasma-based processing steps (e.g., fabrication dry etching step 60 (FIG. 6), plasma-based pre-mold clean step 70, etc.) utilized in the fabrication and manufacture of the electronic device.

Figure 7:
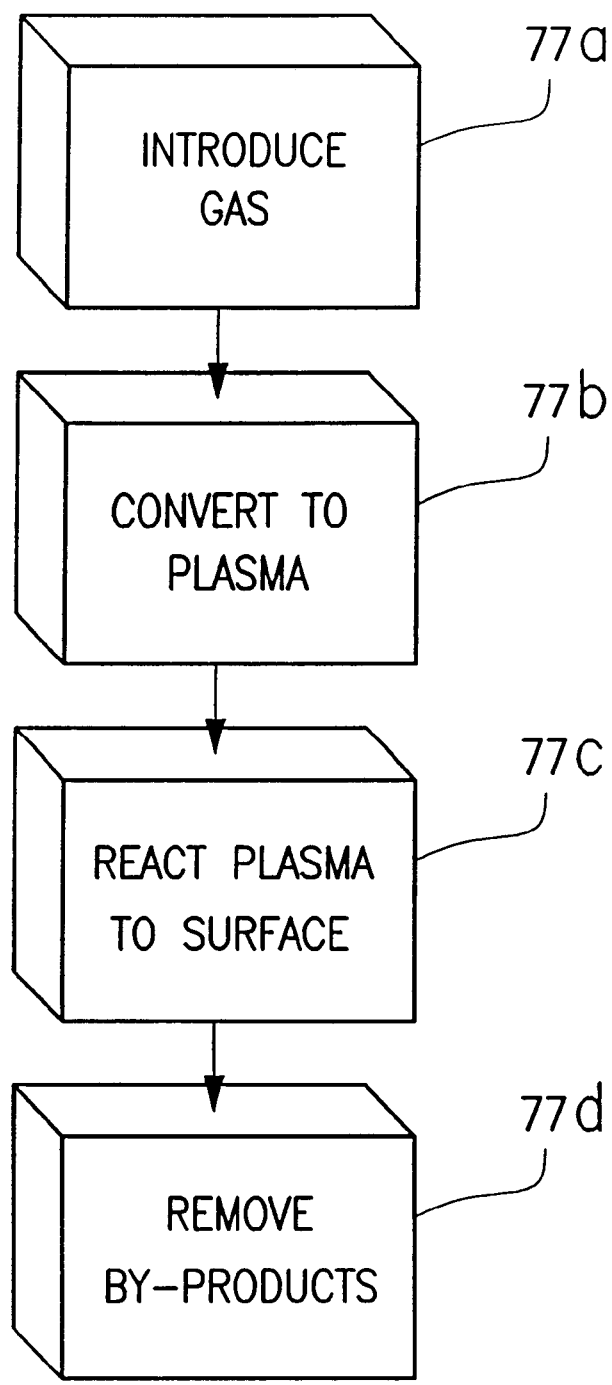
FIG. 7 is a chart depicting the basic process flow for a deflash operation in accordance with a preferred embodiment of the invention.

Although the precise manner of implementing the plasma clean step (step 76) of the invention may differ, the basic process flow for the preferred embodiment of the invention is shown in FIG. 7. In step 77a, a gas is introduced into a plasma cleaner. The gas is converted to a reactive plasma (step 77b) and caused to react on one or more surfaces to be cleaned, e.g., external leads, of the electronic package (step 77c). The reaction on the surface caused by the reactive plasma breaks the organic bond between the surface and any contaminants residing thereon, and produces volatile by-products. These by-products are then removed from the plasma cleaner (step 77d) to complete the deflashing procedure.

Figure 8:
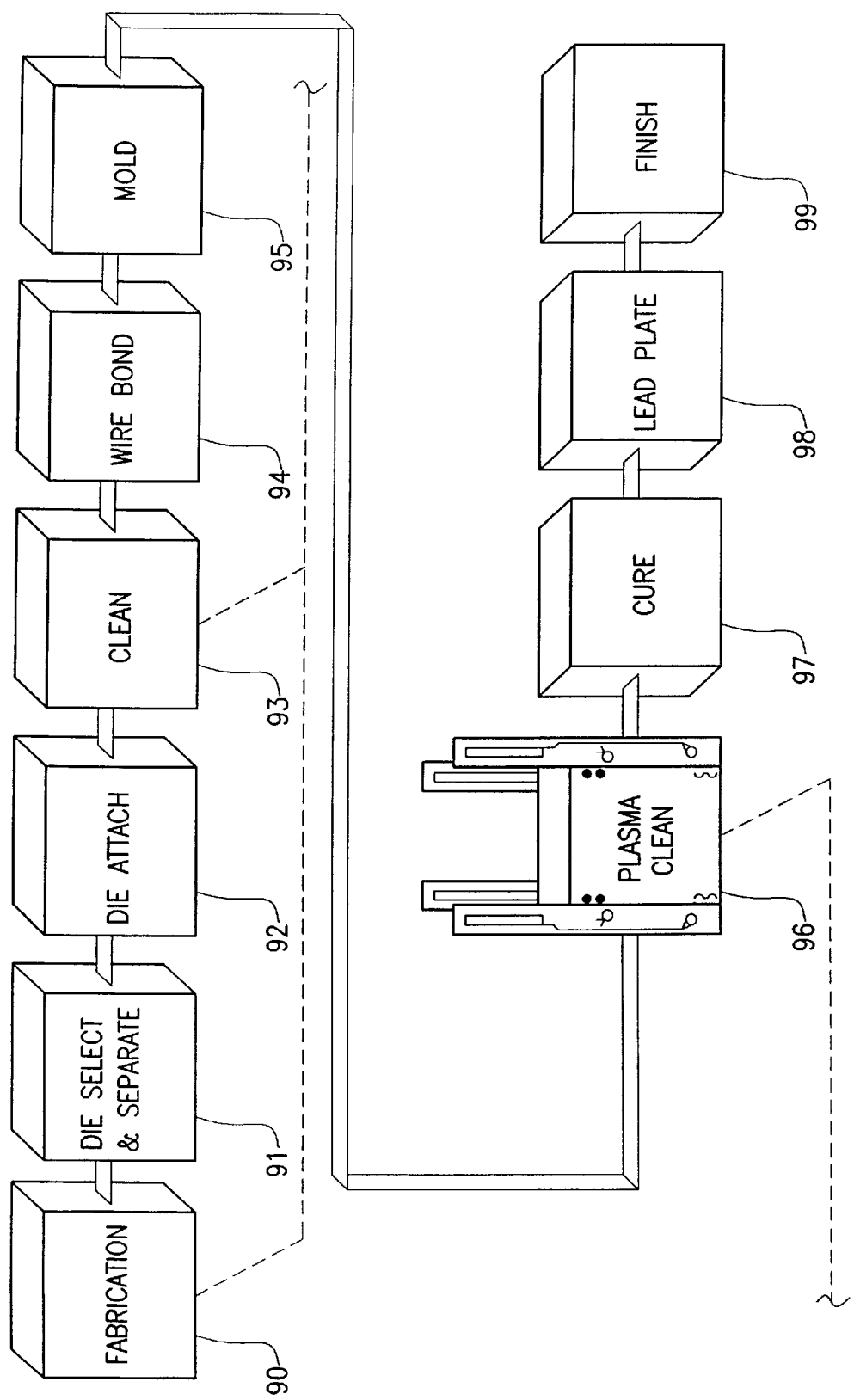
FIG. 8 is a block diagram illustrating an in-line manufacturing system in accordance with a preferred embodiment of the invention.

A basic in-line block diagram of a manufacturing system that may be used to perform the foregoing process of the preferred embodiment is shown in accompanying FIG. 8. (Each section of the system shown in block form could be implemented in any manner known to those of ordinary skill in the art. Any number of different fabrication techniques, for example, known to be used at the time by ordinary skilled artisans may be utilized for the "fabrication" section 90 of the system. As shown, a fabrication section 90 may be used to fabricate one or more electronic devices such as semiconductor integrated circuits in the form of IC dies on a wafer of silicon (or other material). A die selection/separation section 91 provides a determination of which one of the plurality of IC dies will be selected for a particular package currently under process. Typically, the selection will be based on the presence of identifying marks on the IC die indicating the results of a prior inspection in the fabrication section 90. A die attachment section 92 is next utilized to join the selected IC die and a lead frame, as previously discussed. The die attachment section 92 may also include an inspection station used to provide an added degree of quality assurance. A cleaning section 93 can be used to remove any excess epoxy or other material that may appear on the surfaces of the die or lead frame as a result of the previous die attachment. The cleaning section 93 may utilize a plasma cleaner or some other cleaning apparatus known in the art. A wire bonding section 94 follows in the line to provide the necessary electrical connections between the bonding pads on the die and the inner leads of the lead frame.

The attached die and lead frame are then transferred to mold section 95 where the two components are placed in a mold for encapsulation. The resulting encapsulated device forms a package which leaves only outer leads of the lead frame exposed. The plasma cleaning section 96, as discussed above, employs the novel plasma cleaner discussed above to remove any flash or other contaminants that may appear on the encasing or outer leads of the package. This plasma cleaning section 96, in accordance with one preferred embodiment, may be combined with the curing section 97, as discussed above. A lead plating section 98 can then be used to coat the outer leads with a material to improve solderability or conductivity of the package. A variety of miscellaneous operations known in the art (as described above) may then be performed in the finishing section 99 to complete the manufacture of the semiconductor device, as necessary.

While the invention has been described in detail in connection with the best mode of the invention known at the time, it should be readily understood that the invention is not limited to the specified embodiments described. Rather, the invention can be modified to incorporate any number of variations, alterations, substitutions or equivalent arrangements not heretofore described, but that are commensurate with the spirit and scope of the invention.

For example, although the plasma cleaner in the preferred embodiment was disclosed (with reference to FIG. 4) utilizing a source of gas 41 supplied to the process chamber 44 prior to conversion to a reactive plasma, it should be readily understood that the invention could be modified to allow for the conversion of the gas in the source 41 prior to introduction into the process chamber 44 through the gas inlet 40 (with the appropriate modifications, e.g., imposing the electric field in the source 41, etc.). Another exemplary alteration which should be readily apparent is the elimination of the vacuum pump 42 (FIG. 4) when using, for example, atmospheric plasma-based cleaning devices known in the art in which a low pressure environment is not necessary to effect generation of plasma.

In view of the many modifications which can be made, the nature, spirit and scope of the invention is not limited by the foregoing descriptions but is only be limited by the scope of the claims appended hereto.

What is claimed as new and desired to be protected by Letters Patent of the United States is:

1. A method of processing an encapsulated object comprising the steps of:
    encapsulating an object to form an individual package of the object, the individual package having conductive members which are external to the individual package; and
    plasma cleaning the individual package to remove interfering encapsulating material appearing on or between the conductive members.

2. A method as in claim 1, further comprising the step of heating the formed individual package to cure the encapsulation.

3. A method as in claim 2, wherein said step of plasma cleaning and said step of heating the formed individual package are performed at least in some part simultaneously.

4. A method in claim 1, wherein the object is an encapsulated semiconductor device, and said step of plasma cleaning includes removing flash from external leads of the semiconductor device.

5. A method of removing encapsulation flash from a semiconductor package having leads external to the package, the method comprising the steps of:
    placing a semiconductor package in a chamber;
    introducing gas into the chamber;
    converting the gas into a reactive plasma; and
    reacting the plasma on a surface of at least one external lead of the semiconductor package so as to remove flash therefrom.

6. A method as in claim 5, wherein the gas in said introducing step is composed of Argon and air.

7. A method of removing foreign material from external leads of a semiconductor package, the method comprising the steps of:
    transferring a plurality of semiconductor packages to a reaction chamber;
    introducing gas into the reaction chamber;
    causing dissociation in the gas in the reaction chamber; and,
    exposing foreign material on the leads of the semiconductor packages to free radicals derived from the dissociation of the gas in the reaction chamber.

8. A method as in claim 7, wherein said step of heating the semiconductor packages commences prior to and extends during the performance of said step of exposing foreign material on the leads of the semiconductor packages; and wherein said step of transferring a plurality of semiconductor packages commences before said step of causing dissociation in the gas.

9. A process for producing an encapsulated electronic device, the process comprising the steps of:
    fabricating at least one electronic device;
    encapsulating the at least one electronic device;
    plasma cleaning the at least one electronic device after said encapsulating step; and
    curing the encapsulation of said at least one electronic device.

10. A process as in claim 9, wherein said step of plasma cleaning comprises the steps of:
    introducing a plasma gas into a chamber;
    reacting the plasma gas with a surface of the encapsulated electronic device; and
    removing by-products resulting from said step of reacting with the surface of the encapsulated electronic device.

11. A process of manufacturing a package for a semiconductor integrated circuit (IC) device, the process comprising the steps of:
    attaching an IC die to a center pad of a lead frame using a bonding agent;
    plasma cleaning the IC die to remove any excess bonding agent appearing on the IC die;
    wire bonding the IC die to inner leads of the lead frame;
    placing the IC die and the lead frame in a mold;
    injecting encasing material into the mold around the die and the lead frame to form an individual package completely encapsulating the IC die and the inner leads of the lead frame while leaving outer leads of the lead frame exposed;
    plasma cleaning the outer leads of the lead frame to remove any residue encasing material appearing on or between the outer leads of the lead frame as a result of performing said step of injecting encasing material; and
    heating the formed individual package for final curing to produce a package for the semiconductor IC.

12. A process as in claim 11, wherein said step of plasma cleaning the outer leads of the lead frame and said step of heating the formed individual package are performed simultaneously.

13. A process as in claim 11, further comprising the step of plating the outer leads of the lead frame after said step of plasma cleaning and before said step of heating the formed individual package.

14. A process as in claim 11, wherein said step of plasma cleaning the IC die and said step of plasma cleaning the outer leads of the lead frame are conducted using the same plasma cleaning device.

15. A method of making a memory device, the method comprising the steps of:

fabricating a plurality of memory integrated circuits as (IC) dies on a wafer of silicon;

separating a selected IC die from the plurality of IC dies on the wafer;

attaching the selected IC die to a center pad of a lead frame using a bonding agent;

inspecting the IC die and lead frame to ensure the die is attached correctly;

performing a first cleaning step on both the IC die and the lead frame using a plasma cleaner to remove any excess bonding agent IC;

wire bonding the IC die to inner leads of the lead frame;

placing the wire bonded IC die and lead frame in an injection encasement mold;

injecting plastic encasing material into the mold around the wire bonded IC die and lead frame to form an individual package which encapsulates the IC die and the inner leads of the lead frame while leaving outer leads of the lead frame exposed to the external environment;

performing a second cleaning step on the outer leads of the lead frame using the plasma cleaning chamber used in said first cleaning step to remove any residue encasing material appearing on and between the outer leads of the lead frame; and simultaneously, with said second cleaning step, heating the formed individual package for final curing using the plasma cleaning chamber used in both said first cleaning step to produce a memory circuit housed in an encased package.

16. A method of making a memory device, the method comprising the steps of:

fabricating a plurality of memory integrated circuits in the form of a plurality of integrated circuit (IC) dies on a wafer of silicon;

selecting one memory IC die from the plurality of IC dies on the wafer;

after the selection, separating the selected one IC die from the plurality of IC dies on the wafer;

then, attaching the selected IC die to a center pad of a lead frame using a bonding agent of epoxy;

next, performing a first cleaning step on both the IC die and also the lead frame using a plasma cleaner chamber to remove any excess bonding agent resulting from said step of attaching the selected IC die;

next, wire bonding the IC die to inner leads of the lead frame upon plasma cleaning the IC die and lead frame;

then, placing the wire bonded IC die and lead frame in an injection encasement mold;

after said step of placing, injecting plastic encasing material into the mold around the wire bonded IC die and lead frame to form an individual package encapsulating the IC die and the inner leads of the lead frame while leaving outer leads of the lead frame exposed to the environment external to the encased IC die and inner leads of the lead frame;

after said injecting plastic step, performing a second cleaning step on the outer leads of the lead frame using the plasma cleaning chamber used in said first cleaning step now to remove any residue encasing material appearing on and between the outer leads of the lead frame as a result of performing said step of injecting plastic encasing material; and simultaneously with said second cleaning step, heating the formed individual package for final curing using the plasma cleaning chamber used in both said first cleaning step and said second cleaning step to result in a memory device housed in a plastic package.

* * * * *